United States Patent [19]
Kittler

[11] Patent Number: 4,802,967
[45] Date of Patent: Feb. 7, 1989

[54] SURFACE TREATMENT OF POLYMERS

[75] Inventor: Wilfred C. Kittler, Thousand Oaks, Calif.

[73] Assignee: Andus Corporation, Canoga Park, Calif.

[21] Appl. No.: 35,846

[22] Filed: Apr. 8, 1987

[51] Int. Cl.[4] .................. C23C 14/34; C23C 14/06
[52] U.S. Cl. .................. 204/192.14; 204/192.15
[58] Field of Search .................. 204/192.14, 192.15, 204/192.36; 427/40, 249; 428/421, 422

[56] References Cited
U.S. PATENT DOCUMENTS 3,809,635  3/1974  Gillot et al. ............... 204/192.12
4,524,106  2/1985  Flasck ...................... 428/408
4,551,216  11/1985 Argyo ....................... 204/192.15
4,612,100  1/1986  Edeling et al. ............. 204/192.15
4,725,345  2/1988  Sakamoto et al. ........... 204/192.31

OTHER PUBLICATIONS

Handbook of Adhesive Bonding, Charles V. Cagle, pp. 19-17 and 19-18 (1982).
Adhesives Handbook, J. Shields, pp. 90-95, 98-100, 107-108 (3rd ed. 1984).
Chem. Abs. 102:114718v.
Chem. Abs. 102:114719w.
Chem. Abs. 106:187156c.
Chem. Abs. 97:191069q.
Chem. Abs. 95:32052w.
Chem. Abs. 93:56038f.
Chem. Abs. 93:228747e.
World Patent Index WPI 76-68770X/37.
Machine Design, vol. 53, No. 25 (1981).

Primary Examiner—Aaron Weisstuch
Attorney, Agent, or Firm—Yuan Chao; Herbert G. Burkard

[57] ABSTRACT

Polymers of low surface energy, particularly fluoropolymers, may be surface treated by deposition of thin layer of carbon, particularly by magnetron sputtering. Such surface treating improves bondability and printability.

10 Claims, 1 Drawing Sheet

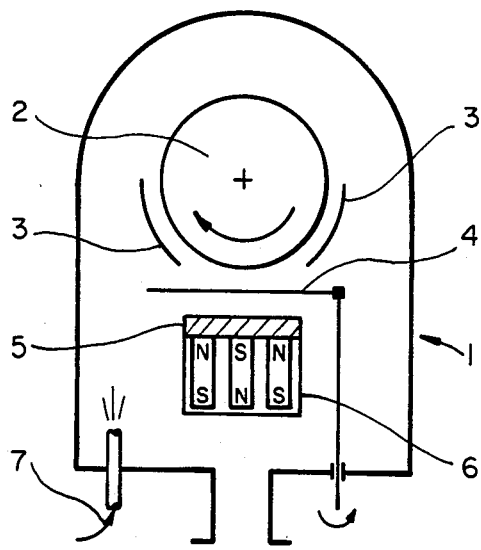
FIG_1
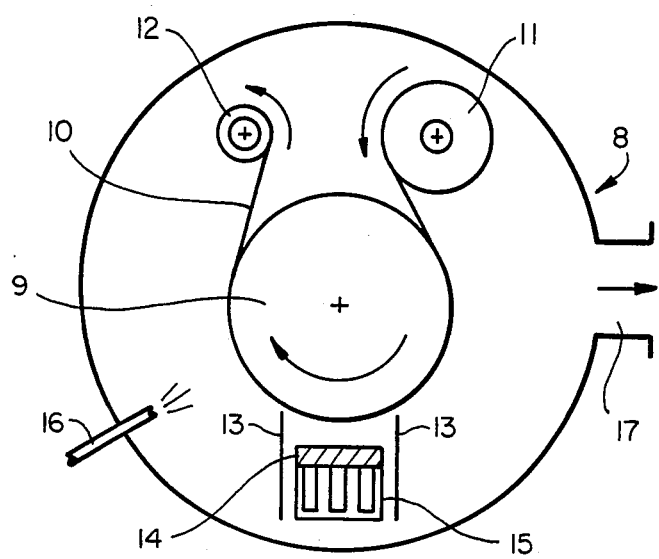
FIG_2

SURFACE TREATMENT OF POLYMERS

The present invention relates to the surface treatment of polymers, particularly polymers of low surface energy or critical surface tension (two different but comparable properties) such as fluoropolymers, for the purpose especially of improving bondability.

Clearly, many instances of use of polymers require that they be bonded to some other material, and examples of such uses include their part in laminates, as insulating matrials, as part of composite materials, as structural members and as substrates for printing. The polymer used will be chosen for its chemical or physical properties, and its ability to bond is only one of many properties that may be in conflict with others, Thus, it is desirable that some technique be available whereby the bondability of a chosen polymer can be improved without excessively impairing other properties.

Polymers having high surface tension and/or surfaces of low or zero polarity may be surface treated to improve bondability. Prior art methods, however, involve aggressive chemical treatment, or corona or glow discharge; such treatments tend to degrade the physical and optical properties of the polymer and may leave undesirable surface residues. An example of a prior art process for treatment of fluorocarbons is given in "Handbook of Adhesive Bonding" edited by C. V. Cagle (McGraw Hill Book Company). Tnat process involves first solvent cleaning with acetone or methyl ethyl ketone, followed by abrasion, and then chemical etching with a solution prepared by mixing sodium metal, naphthalene and tetrahydrofuran. One result of this treatment is that the polymer surface turns brown, which will be undesirable for some purposes.

I have now discovered that polymers, particularly those of low surface energy, may be treated by depositing on their surface a thin layer of carbon. Deposition is preferably carried out by sputtering, especially by magnetron sputtering, and preferably to produce a carbon layer of a few hundred or less angstroms depth. Bondability, which may include printability, may be improved, or the surface may become more receptive to further treatment such as the introduction of specific chemical functionality.

The invention provides a method of improving bondability of a polymeric material, which comprises:
(a) providing a polymeric material having a surface of low critical surface tension; and
(b) depositing onto said surface carbon to form a layer of thickness less than 300 angstroms, said layer being transparent to the naked eye.

The invention also provides a method of bonding together a first and a second material, the first material comprising a polymeric material preferably of low surface energy, which comprises:
(a) depositing onto a surface of said first material a layer of carbon; and
(b) applying said second material to said surface by a suitable method such as flowing or pressing into contact, with or without heating as appropriate.

The invention also provides a method of metallizing a surface of a polymeric material, which comprises:
(a) depositing on said surface a layer of carbon; and then
(b) depositing on said surface a layer of metal.

The invention also provides a method of improving bondability of a fluoropolymer, which comprises:
(a) providing a fluoropolymer having a surface; and
(b) depositing onto said surface a layer of carbon.

The invention also provides a method of providing a visual mark on a surface of a polymeric material, which comprises:
(a) depositing on said surface a layer of carbon; and then
(b) marking said surface with a solvent-based or other ink.

The mechanism by which the surface properties are improved is not fully understood, but it is believed to involve the addition of carbon atoms or groups of atoms into the chemical structure of the polymer at or near the surface by bombardment by energetic carbon atoms, radicals or ions and possibly by electrons. This action is believed to take place primarily at $-CF_3$ groups in those fluorocarbons that possess them.

Carbon has been deposited in the past on various surfaces, but in a different way and for different purposes. Mention may however be made of certain such prior art depositions, by way of comparison.

U.S. Pat, No. 4,612,100 to Edeling et al. discloses a method of manufacturing an implantable electrode for stimulation of heart tissue in which vitreous carbon is sputtered from a vitreous carbon target onto at least a part of the surface of a metal electrode. The purpose of the deposition is to avoid the formation of non-stimulatable tissue at the electrode surface, as occurs with bare metal electrodes. Between 1 and 20 microns of vitreous carbon are deposited.

U.S. Pat. No. 4,524,106 to Flasck discloses a decorative black coating applied to various substrates. The coating is necessarily rather thick since its purpose is visual, and some prior treatment of the substrate is mentioned. Magnetron sputtering is used.

Adhesion of steel wire to rubber in tire manufacture is disclosed in U.S. Pat. No. 3,809,635 to Gillot and Lux as being improved by coating the surface of the steel by carbon. The carbon may be applied by evaporation onto the steel by vacuum, or by subjecting the surface of the steel to corrosive treatment to remove metal while leaving carbon. Thus, a layer of carbon is formed on the metal, and the rubber then applied to the treated surface.

In the present invention various carbon deposition techniques may be used to provide a layer of carbon, generally a thin layer (which will in most cases be of such thickness that it is invisible). Whilst it is not fully understood why this carbon treatment is able to provide the benefits I have found, it is thought that the carbon may become part of the substrate polymer's carbon chain thus giving thin, flexible coatings great stability. Also, carbon by-products may be volatile, thus avoiding the substrate surface becoming poisoned. Preferred thickness of carbon are less than 1000 angstroms, more preferably less than 300 angstroms, particularly less than 100 angstroms, especially less than 50 angstroms. In general, we prefer that the layer be sufficiently thin that it is flexible. Thus the modified polymer surface is preferably ductile. A preferred technique is sputtering, and two preferred magnetron sputtering techniques will now be described by way of example. Carbon thickness may be assessed by comparing sputtering power and time actually used, with those used to produce an easily measurable thick coating.

In a first, small-scale, technique, a film of a polymer to be surface treated is mounted on a rotatable drum in a 46 cm vacuum bell jar coater. A magnetron sputtering device is filled with a graphite target (for example POCO graphite HPD-1, trade mark of POCO Graphite Inc., Texas), and the bell jar is evacuated to a pressure of less than $5 \times 10^{-5}$ torr. An argon gas flow rate is then established to give a pressure of less than 30, preferably less than 20 millitorr. With a shutter between the magnetron sputtering cathode and the film, a glow discharge is established at a power of 2–6, preferably 3.5–4 watts per sq. cm. The shutter is opened when the glow is established and the film passed over the cathode twice by rotating the drum. Separation between the film and the cathode is preferably 3–10 cms, more preferably 5–8 cms, and the speed at which the film is moved is preferably from 1–5, more preferably 2–3 cms per second.

In a small-scale technique, a roll of polymeric film to be surface treated is mounted in a vacuum roll coating apparatus having a roll-winder. A sputtering device as described above may be used, preferably operated at a pressure of 0.5–1, especially 0.6–0.8 millitorr, with a power of 1–2, especially 1.2–1.6 watts per sq. cm. For one size of coating machine, the separation between the film and the cathode is preferably 3–10, more preferably 5–8 cms, and the film is preferably moved at a speed of 1–2, more preferably 1.3–1.7 cms per second.

The above techniques could be scaled-up in a straightforward manner for treatment of larger films or for faster treatment rates.

Various polymeric materials may be surface treated by the methods of the invention. The methods are particularly applicable to polymeric materials of low critical surface tension. Critical surface tension may be defined as the surface tension of a wetting agent whose contact angle with the surface is 90°. The invention is preferably used with materials having a critical surface tension less than 50 dynes/cm, preferably less than 35 dynes/cm, more preferably less than 25 dynes/cm. The critical surface tension increases significantly by the treatment of the method of the invention. Examples of polymeric materials with which the invention may be used include fluoropolymers such as fluorinated ethylene-propylene (eg. that known by the DuPont trade mark FEP Teflon); perfluoroalkoxy-tetrafluoroethylene copolymer (eg. that known by the DuPont trademark PFA Teflon); polyvinyl fluoride (eg. that known by the DuPont trade mark Tedlar); polyvinylidene fluoride (eg. that known by the Pennwalt trade mark Kynar); polychlorotrifluoroethylene copolymer (eg. that known by the Allied Corporation trade mark Halar); and polytetrafluoroethylene (eg. that known by the DuPont trade mark Teflon).

Other polymeric materials to which the invention may be applied include polyimides (eg. that known by the DuPont trade mark Kapton), polyesters, and polyolefins (for example polyethylene and polypropylene).

The polymeric material to be treated may be in any suitable form, and for many end uses polymeric film may be treated. The polymer may however be in the form of thicker sheets or may be in what may be termed three-dimensional form, such as shaped, for example hollow, parts.

Polymeric material treated by the methods of the invention may find use as parts of laminates, as insulating materials, as parts of composite materials, as structural members and as substrates for printing or for deposition of metals. For example an untreated polymeric layer may be bonded to a treated polymeric layer simply by pressure lamination, in many cases in the absence of an adhesive.

Successful laminates have been formed in this way between materials that, without the treatment of the invention, would not adhere to one another. For some materials, a separate adhesive, such as a pressure sensitive adhesive or a reactive system (for example epoxy) may be used, in which case the treatment of the invention may aid bonding of the adhesive material to one or both of the substrates.

The treated polymer may therefore act as a substrate onto which a metal, for example aluminum, copper or silver may be deposited. One way of achieving the aluminum deposition is as follows. Treated polymeric film may be mounted in a 46 cm vacuum bell jar coater at a distance 5–10, especially 7–8 cms above a tungsten coil (preferred size about 0.08 to about 2.5 cm) evaporation source. A quantity of aluminum or other metal to be evaporated was placed in the coil, and the bell jar evaporated to a pressure of less than $1 \times 10^{-4}$ torr. The tungsten filament was then heated by passage of an electric current to a temperature sufficient to cause evaporation of the metal, part of which condenses on the film. A coating of an optical density greater than say 4.0 was easily obtained for a coating of, say, about 700 angstroms, and say 1.7 for a coating of about 450 angstroms. The nature of the metal will of course have an effect, and these values are merely a guide. Metal coatings obtained in this way were firmly bonded to the polymer material, whereas those applied in a control experiment omitting the carbon deposition were poorly bonded.

The treated surface may be further treated with an organic primer (or base coat). Examples include organometallic film forming compounds such as silanes, siloxanes, organotitanates, organosilicates etc. and polymeric materials for example acrylic coatings. A specific example is Chemlok 607 (trade mark of Lord Corp.). The resulting primed surface may then be still further treated, for example, by metallization as described above.

Certain tests were carried out using the treated film to investigate the efficacy of the invention.

A sample of a fluorinated ethylene-propylene (FEP Teflon) was treated by applying a layer of carbon to its surface by either of the methods disclosed above. The sample was tested for wettability with water and other common solvents. It was found that water did not wet the treated surface of the sample, but acetone and isopropyl alcohol caused wetting. The wetting action could, however, be repeated very many times with no carbon removal.

In a second test printability was assessed. Treated fluorinated ethylene propylene (FEP Teflon) and perfluoroalkoxy-tetrafluoroethylene copolymer (PFA Teflon) films were marked using a felt-tip permanent marker (Sandford Sharpie markers, trade mark, were found to be useful although similar results were obtained with other inks). The treated films accepted and retained the ink, but untreated film id not.

Hydrolytic stability of printed film was investigated. Printed film was immersed in boiling water for 30 minutes, after which time no degradation of the printed surface was noted. The printability of an unmarked area of the treated surface was unimpaired. Heat stability was tested in a forced air oven for 15 minutes at 200° C., and no decrease in printability was observed.

An aging and weathering test was carried out by exposing treated fluorinated ethylene-propylene to the outdoors environment in direct sunlight over a 3 week period (Los Angeles). No reduction in printability was noted. Also, no degradation was noted in an indoor environment over 6 months.

Bondability was tested using fluorinated ethylene-propylene (FEP Teflon) and perfluoroalkoxy-tetrafluoroethylene copolymer (PFA Teflon) by applying to treated films of each commonly available pressure sensitive adhesive tapes (No. 250 and No.810, trade designations of 3M). On allowing the tapes to remain in contact with treated film for a few hours at room temperature (or 5 minutes at 100° C.), removal became impossible without severe damage. By contrast, removal was easy from untreated film.

In a further test, film samples of each of the above two fluoropolymers were laminated to aluminum sheet using a multipurpose double face paper tape (Avery Permacel P-02, trade mark), with pressure applied via a hard rubber roller and at room temperature. The samples were separated from the aluminum by 180° peel, and the following maximum peel strengths, and maximum peel strengths for untreated control samples, noted:

| Sample | Treated | Control |
|--------|---------|---------|
| FEP | >553 g/cm | 44 g/cm |
| PFA | >669 g/cm | 204 g/cm |

In addition to peel strength being higher for the treated samples, they were noticeably more consistent, the untreated samples showing severe stick-slip. Peel strengths were also measured after baking the samples at 100° C. for ten minutes; little change was noticed in the untreated samples, but the peel strength of the treated samples increased such that the sample itself failed before peel occurred.

A further bondability test was carried out by pressure laminating a Kapton (trade mark) film to treated FEP Teflon (trade mark), and a control was carried out using untreated FEP Teflon. The lamination was carried out at 270° C. for 20 minutes. No bond was obtained for the control, whereas a 180° peel strength of 142 gm/cm was obtained for the treated film.

As mentioned above, polymeric material treated by the method of the invention may find use as parts of laminates, and composites etc. of these, the following specific uses may be mentioned. Printed circuits may be formed by applying a layer of copper or other conductor to a polymer treated by the method of the invention. The copper layer may then be patterned, ie. selectively removed, to produce the desired circuit, or it may be laid down only where finally desired. Patterning of the carbon layer may be provided for other purposes, and it may be achieved by use of a patterned mask during the sputtering operation. The invention allows printed circuits to be made from substrates of low dielectric constant, and as a result higher frequency signals may be transmitted more effectively. In a second specific use, metallized FEP Teflon or PFA Teflon or other polymer provides a surface for controlling radiant heat transfer from structures such as second surface mirrors for use as spacecraft thermal blankets. Here, the invention allows polymeric substrates of excellent chemical resistance to be used. In a third specific use, polymer sheets, films, fabrics or fibres may be coated with, or cast into, polymeric material for the production of composite materials for structural and other purposes.

Apparatus useful for carrying out the invention is illustrated in FIGS. 1 and 2.

FIG. 1 shows schematically a bell jar sputter coater 1. Within its housing is a rotatable carrier 2 carrying a fluoropolymer film or other substrate to be coated. The carrier 2 is shielded by deposition shielding 3 (which may be fixed) and by a moveable shutter 4 which may be opened for a time chosen according to the extent of deposition desired. A carbon sputter target 5 is shown positioned above a magnetron cathode 6. Various details such as cooling water and electrical connection are omitted for clarity. A sputtering gas inlet is shown as 7.

FIG. 2 shows schematically a roll coating apparatus 8. Apparatus 8 contains a chilled support drum 9 carrying fluoropolymer film 10 or other substrate to be treated. Untreated film is supplied from pay-roll 11, and treated film is re-wound onto take-up roll 12. Shields 13 are provided to control the sputtering beam. As before, carbon sputter target 14 is shown above a magnetron cathode 14. A gas inlet 16 and a vacuum outlet 17 are also shown.

I claim:
1. A method of improving bondability of a polymeric material, which comprises:
 (a) providing a polymeric material having a surface of low critical surface tension; and
 (b) sputtering onto said surface a layer consisting essentially of carbon and having a thickness less than 300 angstroms, said layer being transparent to the naked eye.
2. A method according to claim 1, in which the carbon is deposited by magnetron sputtering.
3. A method according to claim 2, in which said layer is less than 100 angstroms thick.
4. A method according to claim 3, in which said layer is less than 50 angstroms thick.
5. A method according to claim 2, in which the polymeric material comprises a fluoropolymer, a polyolefin, a polyester or a polyimide.
6. A method of improving bondability of a fluoropolymer, which comprises:
 (a) providing a fluoropolymer having a surface; and
 (b) sputtering onto said surface a layer consisting essentially of carbon.
7. A method according to claim 6, wherein said layer is less than 300 angstroms thick.
8. A method according to claim 7, wherein said layer is less than 100 angstroms thick.
9. A method according to claim 8, wherein said layer is less than 50 angstroms thick.
10. A method according to claim 6, wherein said layer is deposited by magnetron sputtering.

* * * * *